(12) United States Patent
Nakagawa et al.

(10) Patent No.: US 11,906,899 B2
(45) Date of Patent: Feb. 20, 2024

(54) MASK DEFECT REPAIR APPARATUS AND MASK DEFECT REPAIR METHOD

(71) Applicant: HITACHI HIGH-TECH SCIENCE CORPORATION, Tokyo (JP)

(72) Inventors: Yoshitomo Nakagawa, Tokyo (JP); Mitsuto Aso, Tokyo (JP); Katsumi Suzuki, Tokyo (JP); Mamoru Okabe, Tokyo (JP); Masakatsu Hasuda, Kanagawa (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 531 days.

(21) Appl. No.: 16/785,368

(22) Filed: Feb. 7, 2020

(65) Prior Publication Data

US 2020/0310246 A1    Oct. 1, 2020

(30) Foreign Application Priority Data

Mar. 25, 2019 (JP) ................................ 2019-057369

(51) Int. Cl.
  *G03F 1/74*    (2012.01)
  *H01J 37/317*  (2006.01)
(52) U.S. Cl.
  CPC ............ *G03F 1/74* (2013.01); *H01J 37/3178* (2013.01)

(58) Field of Classification Search
  CPC ............................... G03F 1/74; H01J 37/3178
  See application file for complete search history.

(56) References Cited

U.S. PATENT DOCUMENTS

| | | | | |
|---|---|---|---|---|
| 4,902,530 A | * | 2/1990 | Yasaka | G03F 1/74 427/140 |
| 2017/0074807 A1 | * | 3/2017 | Nishimura | G03F 1/60 |
| 2017/0248842 A1 | * | 8/2017 | Oster | C23C 14/28 |

FOREIGN PATENT DOCUMENTS

| | | |
|---|---|---|
| JP | 2006133785 A | 5/2006 |
| JP | 2006350219 A | 12/2006 |

* cited by examiner

*Primary Examiner* — Peter L Vajda
*Assistant Examiner* — Jayson D Cosgrove
(74) *Attorney, Agent, or Firm* — Holland & Hart LLP (57) ABSTRACT

Disclosed is a mask defect repair apparatus that is capable of performing defect repair with high accuracy without exposure of a mask to air while being moved between the mask defect repair apparatus and an inspection device. The mask defect repair apparatus emits charged particle beams with an amount of irradiation therewith which is corrected by a correction unit while supplying gas to a defect of the mask, thereby forming a deposition film.

1 Claim, 10 Drawing Sheets

To charged particle beam irradiation device and display device

MASK DEFECT REPAIR APPARATUS AND MASK DEFECT REPAIR METHOD

CROSS REFERENCE TO RELATED APPLICATION(S)

This application claims the benefit of Japanese Patent Application No. 2019-057369, filed Mar. 25, 2019, which is hereby incorporated by reference in its entirety into this application.

BACKGROUND OF THE INVENTION

1. Technical Field

The present invention relates to a mask defect repair apparatus and a mask defect repair method.

2. Description of the Related Art

A mask defect repair apparatus for repairing a defect of a mask by using a charged particle beam device that emits a focused ion beam, an electron beam, or the like, is known.

In this regard, in order to correct a defect in a gray tone mask on which a pattern film with an intermediate light transmittance is formed, there is known a method of correcting a defect on a gray tone pattern film by using a pattern film correction device including ion optics generating focused ion beams, a secondary charged particle detector detecting secondary charged particles caused by irradiating the mask with the focused ion beams, an image processing device obtaining information on the ion optics and the secondary charged particle detector to process pattern information of the mask, and a compound vapor spray device spraying organic compound vapors to the defect for correction by forming an FIB-CVD film on a position of the defect in the mask which is obtained from the information of the image processing device. In the method of correcting the defect on the gray tone pattern film, before the FIB-CVD film is formed, a pre-process is provided in which the focused ion beams are emitted to a portion of the defect for removal where the pattern film is left with abnormal thickness, and thus the defect region has no pattern film formed thereon. A region positioned inside from the boundary of the defect region after the pre-process by a length depending on the radius of the focused ion beams is determined as a focused ion beam irradiation region, and then the FIB-CVD film is formed thereon. The focused ion beams are emitted a predetermined number of times with a spray of the organic compound vapors, and the FIB-CVD film having a predetermined light transmittance is formed on a region not overlapping the pattern film (see patent document 1).

Also, as a type of mask in which defect is repaired by such a defect repair method, a halftone mask having a transparent substrate, a semitransmission layer, and a light shield layer is known (see patent document 2).

DOCUMENTS OF RELATED ART

Patent Documents (Patent Document 1) Japanese Patent Application Publication No. 2006-350219
(Patent Document 2) Japanese Patent Application Publication No. 2006-133785

SUMMARY OF THE INVENTION

In clear defect repair for a mask such as a halftone mask, or the like, it was necessary to perform accurate repair so that the light transmittance after repair was within a predetermined range. The light transmittance is related to film thickness of the film formed by the clear defect repair. However, in the conventional defect repair method, the defect repair apparatus performed film formation on the mask, and moved the mask to an inspection device to identify transmittance. Then, when the clear defect repair was found insufficient, the mask was moved back to the defect repair apparatus to perform clear defect repair. Because of this, the operation took a lot of time. Further, there was a concern that a new defect might occur due to the exposure of the mask to air while being moved between the apparatus and the device (specifically, between the defect repair apparatus and the inspection device).

Accordingly, the present disclosure has been made keeping in mind at least one of such problems occurring in the related art, and the present disclosure is intended to propose a mask defect repair apparatus and a mask defect repair method in which defect repair is performed with high accuracy without exposure of a mask to air while being moved between the mask defect repair apparatus and the inspection device.

According to an aspect of the present disclosure, there is provided a mask defect repair apparatus configured to form a standard deposition film by charged particle beam-induced deposition, adjust an amount of irradiation with the charged particle beams by using a result of measuring a film thickness, and form a deposition film on a defect of a mask to repair the defect, the mask defect repair apparatus including: a charged particle beam emission unit emitting the charged particle beams; a stage moving the mask; a gas supply unit supplying gas to form the deposition film by irradiation with the charged particle beams; a control unit controlling the charged particle beam emission unit and the gas supply unit; a storage storing calibration data that represents a relationship between an area of the deposition film and the amount of irradiation with the charged particle beams; a film thickness measurement unit measuring the film thickness of the standard deposition film; and a correction unit correcting the amount of irradiation with the charged particle beams based on the calibration data and the film thickness of the standard deposition film measured by the film thickness measurement unit, wherein the control unit controls the charged particle beams to be emitted with the amount corrected by the correction unit while the gas is supplied to the defect of the mask to form the deposition film.

Further, according to another aspect of the present disclosure, as the film thickness measurement unit, a white light interference measurement device may be used.

Further, according to another aspect of the present disclosure, the area of the deposition film may be smaller than an area of the standard deposition film.

Further, according to another aspect of the present disclosure, as the film thickness measurement unit, an atomic force microscope may be used.

Further, according to another aspect of the present disclosure, the area of the deposition film may be larger than an area of the standard deposition film.

Further, according to another aspect of the present disclosure, there is provided a mask defect repair method including: forming a standard deposition film by charged particle beam-induced deposition; measuring a film thickness of the standard deposition film; correcting, based on the film thickness of the standard deposition film and calibration data that represents a relationship between an area of a deposition film and an amount of irradiation with the charged particle beams, the amount of irradiation with the charged particle beams which is used in the formation of the standard deposition film; moving a defect of a mask to a position at which irradiation with the charged particle beams takes place; and emitting the charged particle beams in the corrected amount while supplying gas for forming the deposition film on the defect to form the deposition film.

According to the at least one of the present disclosure, the mask defect repair apparatus and the mask defect repair method can be provided in which defect repair is performed with high accuracy without exposure of the mask to air while being moved between the mask defect repair apparatus and the inspection device.

BRIEF DESCRIPTION OF THE DRAWINGS

The above and other objectives, features, and advantages of the present disclosure will be more clearly understood from the following detailed description taken in conjunction with the accompanying drawings, in which.

DESCRIPTION OF THE PREFERRED EMBODIMENTS

Embodiment

Hereinafter, an embodiment of the present disclosure will be described with reference to the accompanying drawings.

<Clear Defect Repair to a Halftone Mask>

A halftone mask is provided with a pattern formed from a shielding film that shields exposure light (g-line at the wavelength of 436 nm, h-line at the wavelength of 405 nm, or mixed light of g-line and h-line) and a halftone film (transmitting about 20% to 50%). In clear defect repair to the halftone film, light transmittance in a repair portion needs to be controlled to be within a predetermined range.

When measuring the light transmittance with respect to the exposure wavelength, the area of the deposition film by the charged particle beams needs to be about 100 square micrometers or more. However, the size of the clear defect is usually about several microns or less. It was difficult to measure the light transmittance of the deposition film in that size with a conventional light transmittance measurement device.

Figure 1:
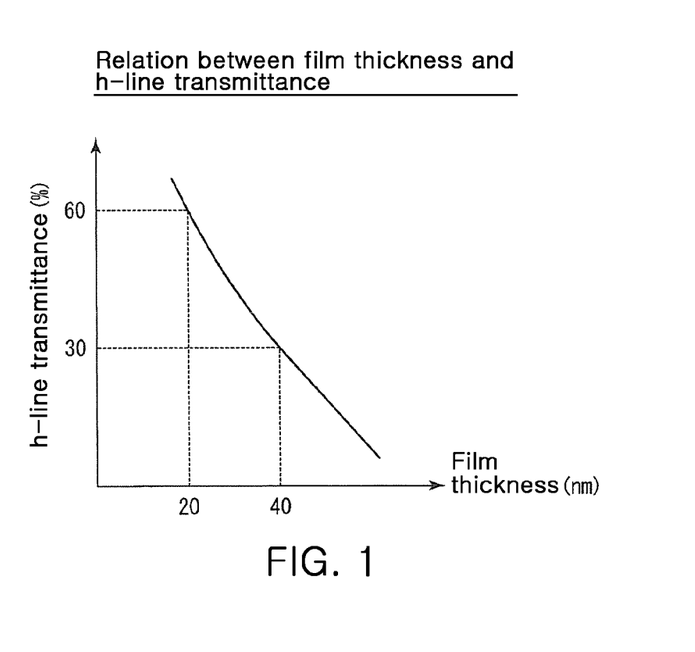
FIG. 1 is a diagram illustrating an example of a relationship between a film thickness of a deposition film and light transmittance.

Herein, the film thickness of the deposition film and the light transmittance have a relationship as shown in FIG. 1. FIG. 1 is a diagram illustrating an example of a relationship between a film thickness of a deposition film and light transmittance. From this relationship, it is found that even in the case of a micro-sized film of which the light transmittance cannot be measured, accurate clear defect repair may be performed by forming the deposition film of the film thickness corresponding to a desired light transmittance.

However, in the case of forming a deposition film having a certain film thickness, the amount of irradiation with the charged particle beams and the area of the deposition film do not have a simple proportional relationship. Thus, the defect repair apparatus according to the present embodiment stores calibration data for changing the amount of irradiation with the charged particle beams, and corrects the calibration data based on a result of measuring the film thickness by a film thickness measurement device so as to perform deposition of a fixed film thickness according to the area of the deposition film and to repair the clear defect.

<A Configuration of a Defect Repair Apparatus>

Figure 2:
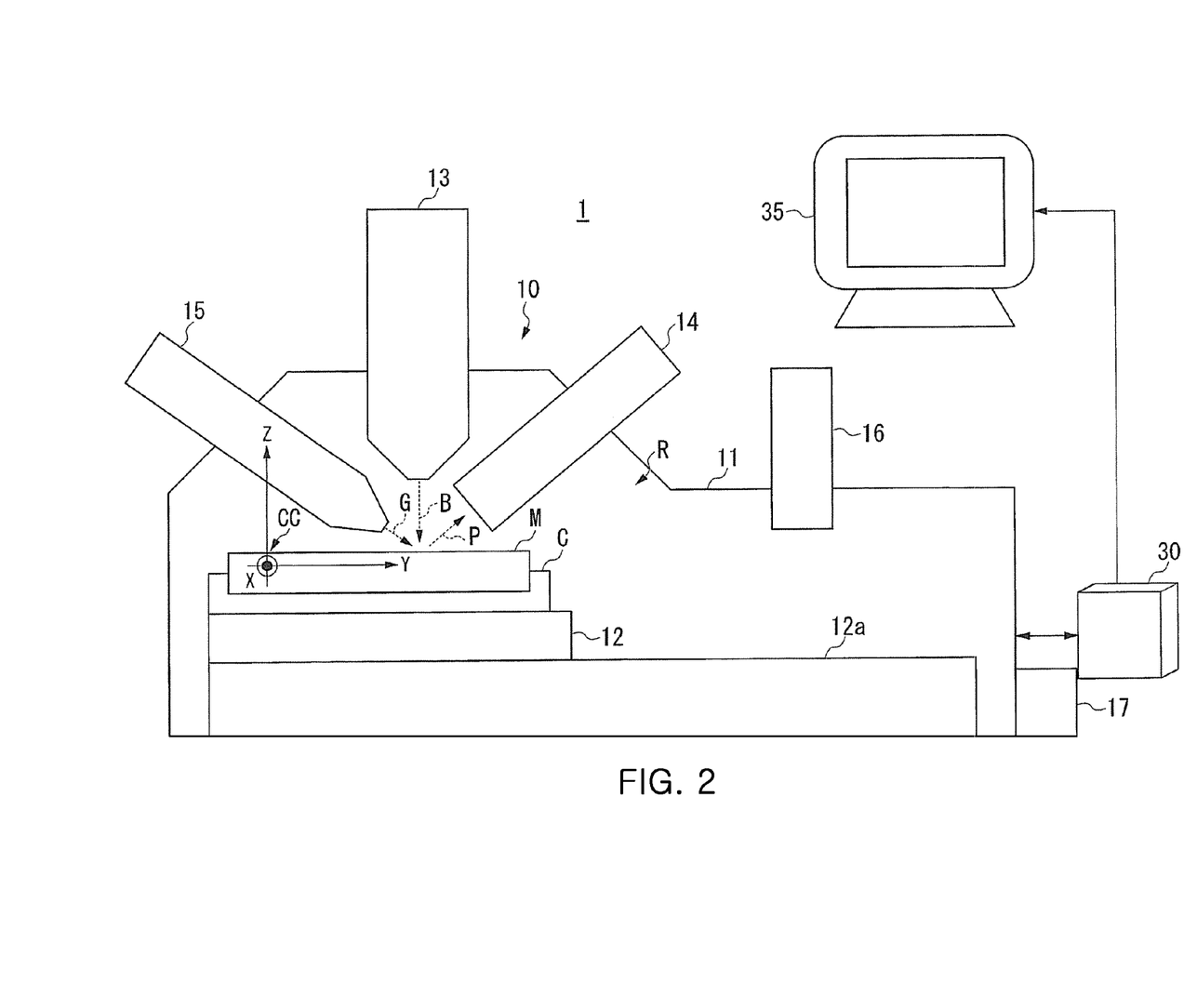
FIG. 2 is a diagram illustrating an example of a configuration of a defect repair apparatus 1 according to an embodiment of the present invention.

First, the configuration of the defect repair apparatus 1 will be described. FIG. 2 is a diagram illustrating an example of the configuration of the defect repair apparatus 1 according to an embodiment of the present disclosure.

The defect repair apparatus 1 includes a charged particle beam irradiation device 10, a control device 30, and a display device 35. Further, in the defect repair apparatus 1 in this example, the charged particle beam irradiation device 10, the control device 30, and the display device 35 are individually configured. However, instead of this, some or all of the charged particle beam irradiation device 10, the control device 30, and the display device 35 may be integrally configured.

The charged particle beam irradiation device 10 includes, for example, a housing 11, a stage 12, a charged particle beam emission unit 13, a secondary particle detection unit 14, a gas supply unit 15, a film thickness measurement unit 16, and a vacuum pump 17.

The stage 12 is provided in a processing room R which is the inside of the housing 11. On the stage 12, as shown in FIG. 2, a cassette C is mounted. Further, on the cassette C, a mask M is placed. The cassette C is a jig for placing the mask M on the stage 12. The mask M is a mask on which a pattern film is formed so that the mask has multiple portions having different values of light transmittance. Hereinafter, as an example, the case where the mask M is a multi-gradation mask used during a photolithography process in manufacture of a flat panel display (FPD) and is also a halftone mask will be described. Further, the mask M may be another mask such as a photomask for a semiconductor, or the like, instead of the mask used during the photolithography process in the manufacture of the FPD.

Figure 3:
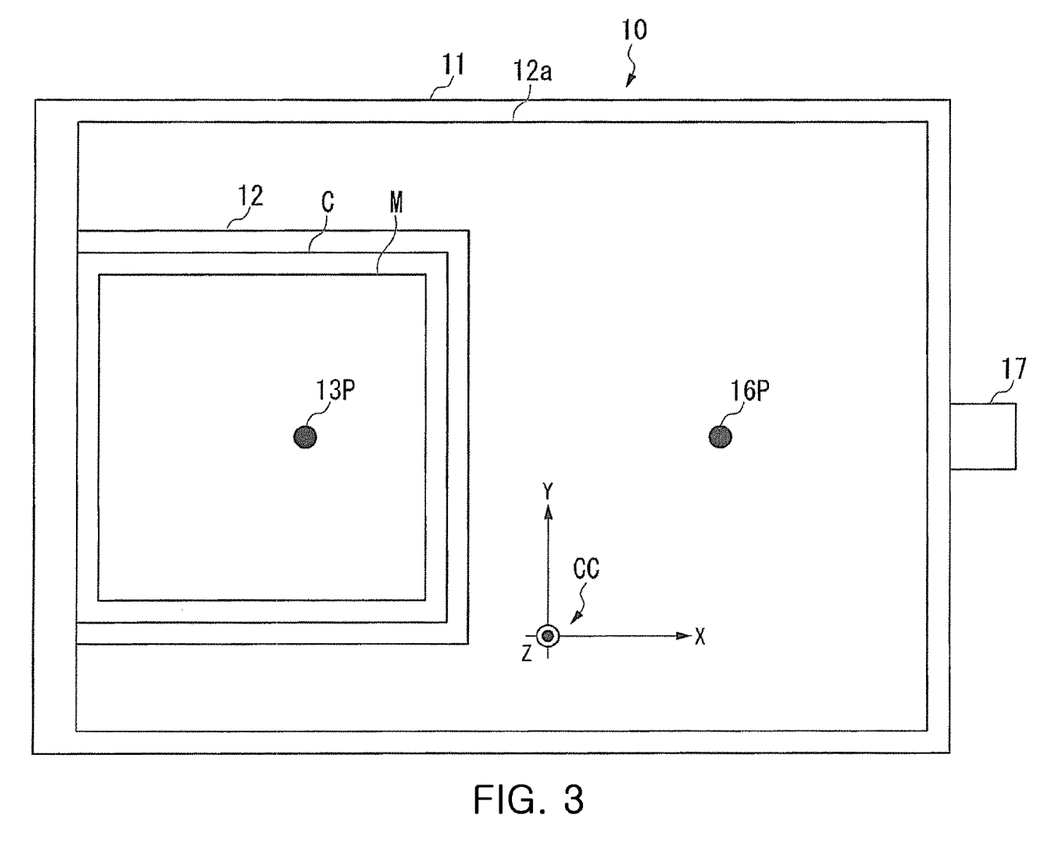
FIG. 3 is a plan diagram of a charged particle beam irradiation device 10.

The stage 12 is supported by a displacement unit 12a. The displacement unit 12a includes an actuator that operates in response to a request from the control device 30, and moves the position of the stage 12 along an X-Y plane in a three-dimensional coordinate system CC as shown in FIG. 3. FIG. 3 is a plan diagram of the charged particle beam irradiation device 10. The three-dimensional coordinate system CC is a three-dimensional orthogonal coordinate system corresponding to the defect repair apparatus 1. In the examples shown in FIGS. 2 and 3, the negative direction of the Z axis in the three-dimensional coordinate system CC is the same as the gravity direction. Further, the negative direction may not be the same as the gravity direction. The point 13P shown in FIG. 3 denotes a position at which the mask is irradiated with the charged particle beams from the charged particle beam emission unit 13. Further, the point 16P denotes a position at which the film thickness is measured by the film thickness measurement unit 16. Herein, in FIG. 3, in order to simplify the figure, the charged particle beam emission unit 13, the secondary particle detection unit 14, the gas supply unit 15, and the film thickness measurement unit 16 are not shown. The position of the stage 12 is represented by, for example, the position of the center of the upper surface of the stage 12. Further, instead of this, the position of the stage 12 may be represented by another position corresponding to the stage 12.

The charged particle beam emission unit 13 is, for example, a focused ion beam column that emits focused ion beams as charged particle beams B. Hereinafter, as an example, the case where the charged particle beam emission unit 13 emits focused ion beams of gallium ions as the charged particle beams B will be described. Further, the charged particle beam emission unit 13 may be configured to emit focused ion beams of another type of ion (for example, gas ions such as helium, argon, xenon, or the like) instead of the gallium ions. Further, the charged particle beam emission unit 13 may be, instead of the focused ion beam column, a column emitting another type of particle beam as charged particle beams B, such as an electron beam column emitting electron beams as charged particle beams B, or the like.

The charged particle beam emission unit 13 is inserted from the outside of the housing 11 to the inside (specifically, the processing room R) of the housing 11. In the example shown in FIG. 2, among end portions of the charged particle beam emission unit 13, the end portion at a side from which the charged particle beams B are emitted is positioned in the inside of the housing 11. Among the end portions of the charged particle beam emission unit 13, the end portion at a side from which the charged particle beams B are not emitted is positioned in the outside of the housing 11. Alternatively, the whole charged particle beam emission unit 13 may be provided in the processing room R. The processing room R may be an example of a reception unit.

The secondary particle detection unit 14 detects secondary particles P that are generated from a subject irradiated with the charged particle beams B. The secondary particles P are, for example, charged particles of secondary electrons, such as scattered electrons, or the like, and of secondary ions, such as scattered ions, back-scattered ions, or the like. When the secondary particle detection unit 14 detects the secondary particles P, the secondary particle detection unit 14 outputs information indicating the detected secondary particles P to the control device 30. The information includes, for example, information indicating the number of the secondary particles P. This information may involve ionic species obtained from the mass of the secondary charged particles.

The gas supply unit 15 supplies gas G for deposition as a compound gas containing a material (for example, pyrene, naphthalene, phenanthrene, platinum, carbon, tungsten, or the like) which is a raw material for the deposition film. When the gas G is supplied from the gas supply unit 15 and is attached on the mask and that portion is irradiated with the charged particle beams B, the deposition film having a light shielding characteristic is fixed and formed on the mask.

Figure 4:
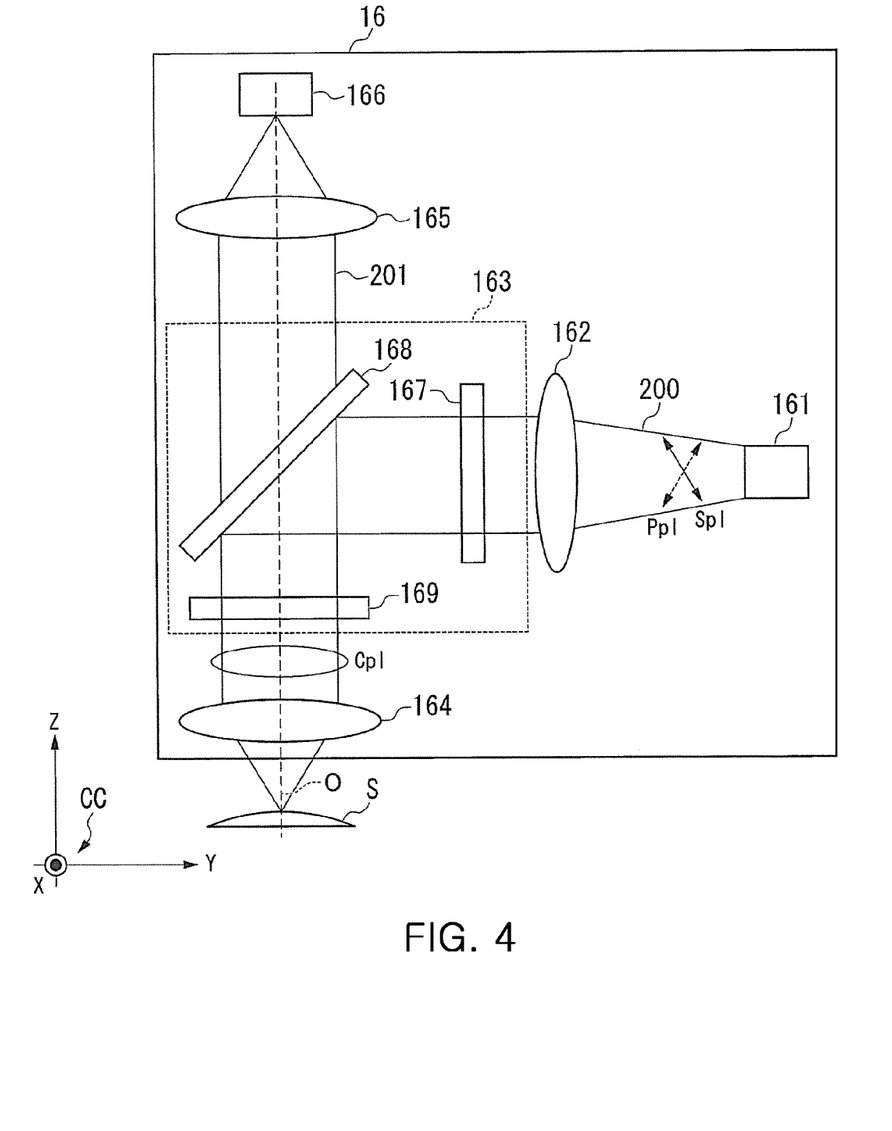
FIG. 4 is a diagram illustrating an example of a configuration of a film thickness measurement unit 16.

The film thickness measurement unit 16 measures the film thickness of the deposition film formed on the subject. Hereinafter, as an example, the case where the film thickness measurement unit 16 is a white light interference measurement device will be described. Herein, with reference to FIG. 4, a configuration of the film thickness measurement unit 16 will be described. FIG. 4 is a diagram illustrating an example of a configuration of a film thickness measurement unit 16.

The film thickness measurement unit 16 includes a white light source 161, a collimating lens 162, a polarization correction unit 163, an interference objective lens 164, an image-forming lens 165, and a light-receiving element 166. Further, the subject S shown in FIG. 4 represents any subject placed on the stage 12. That is, the subject S is, for example, the mask M, a subject different from the mask M, or the like.

The white light source 161 emits white light beams 200. The white light source 161 is, for example, a halogen light source capable of emitting natural light. The white light source 161 emits diffusion light beams that are in a state where a phase relationship between two orthogonal polarization components (P polarization Ppl and S polarization Spl shown in FIG. 4) of light waves is irregular (non-polarization). The collimating lens 162 collimates the incident white light beams 200 into parallel light beams. Further, the resulting white light beams 200 that have passed through the collimating lens 162 remain unpolarized.

The polarization correction unit 163 is placed between the collimating lens 162 and the interference objective lens 164. The polarization correction unit 163 includes a polarizing plate 167, a beam splitter 168, and a ¼ wavelength plate 169.

The polarizing plate 167 converts the unpolarized white light beams 200 passed through the collimating lens 162 into linearly polarized white light beams. That is, the polarizing plate 167 converts P polarization Ppl and S polarization Spl into a state where a bias occurs in advance. Alternatively, the polarizing plate 167 may be placed between the white light source 161 and the collimating lens 162.

The beam splitter 168 reflects the linearly polarized white light beams 200 in the direction of the interference objective lens 164 among the two directions along an optical axis O. On a reflective surface of the beam splitter 168 which reflects the resulting white light beams 200, a dielectric film is deposited (formed). Because of this, when reflecting the resulting white light beams 200, the beam splitter 168 causes the magnitude of the attenuation of P polarization Ppl to be greater than the magnitude of the attenuation of S polarization Spl so that the bias occurs in P polarization Ppl and S polarization Spl. However, since the polarizing plate 167 causes the bias in P polarization Ppl and S polarization Spl in advance, the influence of the bias in the polarization components caused by the reflection by the beam splitter 168 is limited.

The ¼ wavelength plate 169 is a birefringence element that causes a phase difference of an angle of 90 degrees between the two orthogonal polarization components. Because of this, the ¼ wavelength plate 169 converts the resulting white light beams 200 obtained by reflecting the linearly polarized white light beams 200 by the beam splitter 168 into a white light beams 200 of circular polarization Cpl. That is, the polarization correction unit 163 may correct the resulting white light beams 200 incident on the interference objective lens 164 into the circularly polarized light beams in a state where there is no bias in P polarization Ppl and S polarization Spl.

Figure 5:
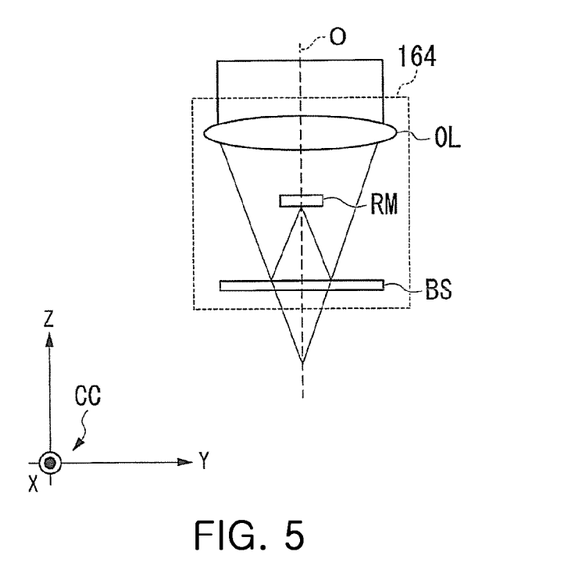
FIG. 5 is a diagram illustrating an example of a configuration of a Mirau interference objective lens 164 where a reference mirror RM and a beam splitter BS are placed on an optical axis O.
Figure 6:
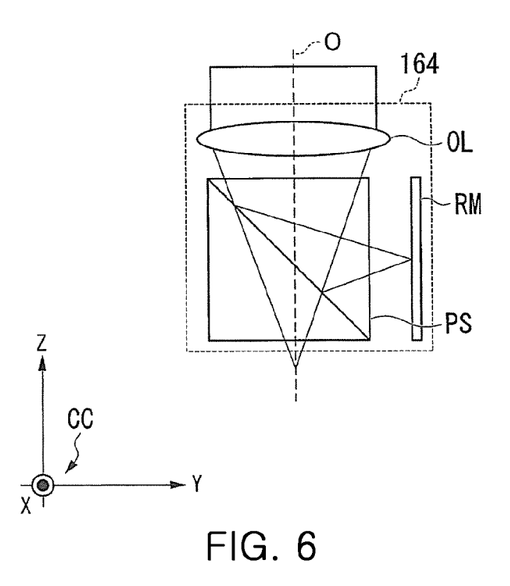
FIG. 6 is a diagram illustrating an example of a configuration of a Michelson interference objective lens 164 where a reference mirror RM is placed outside an optical axis O and a prism PS is placed on the optical axis O.

The interference objective lens 164 focuses the resulting white light beams 200 that have been reflected by the beam splitter 168 and then have passed through the ¼ wavelength plate 169, in the direction toward the interference objective lens 164 from the image-forming lens 165 among the two directions along the optical axis O so as to irradiate the subject S. Herein, the interference objective lens 164 includes an objective lens OL, a reference mirror RM, and a beam splitter BS (or a prism PS) as shown in FIGS. 5 and 6. The objective lens OL focuses the resulting white light beams 200 which are parallel light beams to irradiate the subject S. Because of this, the resulting white light beam 200 focused on the subject S is in a state where there is no bias in P polarization Ppl and S polarization Spl. The beam splitter BS (or the prism PS) reflects the resulting white light beam 200 focused on the subject S to generate reference light beams (specifically, the reference light beams are light beams branching from the focused white light beams 200). The reference mirror RM is placed at a focal position of the reference light beams and reflects the reference light beams. The reflected reference light beams are combined, at the position of the beam splitter BS (or the prism PS), with measurement light beams that is light beams obtained from the reflection off the subject S. Interference light beams 201 in which the measurement light beams and the reference light beams are combined return in the direction of the beam splitter 168 along the optical axis O. Further, the interference objective lens 164 shown in FIG. 5 is a Mirau interference objective lens where the reference mirror RM and the beam splitter BS are placed on the optical axis O, and is usually used for high magnification. That is, FIG. 5 is a diagram illustrating an example of a configuration of the Mirau interference objective lens 164 where the reference mirror RM and the beam splitter BS are placed on the optical axis O. The interference objective lens 164 shown in FIG. 6 is a Michelson interference objective lens where the reference mirror RM is placed outside the optical axis O and the prism PS is placed on the optical axis O, and is usually used for low magnification compared to the Mirau interference objective lens. That is, FIG. 6 is a diagram illustrating an example of a configuration of the Michelson interference objective lens 164 where the reference mirror RM is placed outside the optical axis O and the prism PS is placed on the optical axis O.

The image-forming lens 165 performs image formation on the interference light beams 201 passing through the beam splitter 168.

The light-receiving element 166 is a light-receiving element in which pixels are arranged on a two-dimensional plane, and receives an interference pattern that results from the image formation by the image-forming lens 165.

Further, the interference pattern caused by the interference light beams 201 is generated due to the difference in shape between the subject S and the reference mirror RM. Because of this, in the present embodiment, since the resulting white light beams 200 focused on the subject S have circular polarization and are high-quality illumination light beams, homogeneous interference light beams 201 are obtained. That is, in the present embodiment, correcting of the resulting white light beams 200 focused on the subject S into the circularly polarized light beams is not to avoid occurrence of stray light or reflected light between the interference objective lens 164 and the light-receiving element 166 but to obtain high-quality illumination light beams. Even if stray light or reflected light occurs, the film thickness measurement unit 16, which is a white light interference measurement device using the principle of white light interference, is capable of measuring the film thickness of the deposition film formed on the subject S with high resolution of 1 angstrom or less without significant influence on the contrast of the interference pattern.

The film thickness measurement unit 16 is configured as a white light interference measurement device as described above, and measures, based on the interference pattern of the interference light beams 201 received by the light-receiving element 166, a height of an uneven part formed on the subject S as a deviation from a reference height. That is, in the case where the subject S is the mask M, the film thickness measurement unit 16 sets the height of the surface of the mask M that is placed on the cassette C and does not have a defect portion (the mask M manufactured in accordance with mask M design data) as a reference height, and measures, as a deviation from the reference height, the film thickness of the deposition film formed on the mask M. Note that, in the present embodiment, the height refers to the position of the Z axis in the three-dimensional coordinate system CC. The film thickness measurement unit 16 outputs information indicating the measured film thickness to the control device 30.

Herein, when the film thickness measurement unit 16 is the white light interference measurement device, a window for focusing the resulting white light beams 200 on the subject S is provided in the processing room R (or the film thickness measurement unit 16), specifically, between the film thickness measurement unit 16 and the processing room R.

Further, the film thickness measurement unit 16 may be, instead of the white light interference measurement device, another device such as an atomic force microscope, or the like, which is capable of measuring the film thickness of the deposition film formed on the subject. The configuration of the atomic force microscope is described in detail in, for example, Japanese Patent Application Publication No. Hei. 08-166395, and thus a description thereof is omitted.

The vacuum pump 17 is a pump that exhausts gas in the processing room R to cause the inside of the processing room R to be in a high-vacuum state with less than 0.001 pascal.

The charged particle beam irradiation device 10 is connected to the control device 30 via a cable in a communicative manner. As a result of this, the stage 12, the displacement unit 12a, the charged particle beam emission unit 13, the secondary particle detection unit 14, the gas supply unit 15, the film thickness measurement unit 16, and the vacuum pump 17 of the charged particle beam irradiation device 10 perform respective operations based on the control signals acquired from the control device 30. Further, wired communication via a cable is performed according to, for example, a standard such as Ethernet (registered trademark), Universal Serial Bus (USB), or the like. Alternatively, the charged particle beam irradiation device 10 may be connected to the control device 30 by wireless communication performed according to a communication standard such as Wi-Fi (registered trademark), or the like.

The control device 30 is, for example, an information processing device such as a desktop personal computer (PC), a workstation, a note PC, or the like. Further, instead of these, the control device 30 may be another information processing device, such as a tablet PC, a multifunctional mobile terminal (smartphone), or the like.

The control device 30 controls, based on the manipulation received from the user (or an active program), the whole charged particle beam irradiation device 10. For example, the control device 30 causes the gas supply unit 15 to supply the gas G to a designated position and also causes the charged particle beam emission unit 13 to emit the charged particle beams B, thereby forming the deposition film on the designated position. The designated position is, for example, the defect portion of the mask M. The defect portion of the mask M refers to, in this example, a clear defect portion that is a portion where the pattern film formed on the mask M is damaged among the portions contained the mask M. Alternatively, the defect portion of the mask M may include another portion contained in the mask M.

Further, the control device 30 may acquire information indicating the secondary particles P detected by the secondary particle detection unit 14 from the secondary particle detection unit 14, and generates an observation image based on the acquired information. The observation image refers to an image of the portion within the field of view of the secondary particle detection unit 14 among the portions contained in the mask M. The control device 30 causes the display device 35 to display the generated observation image.

The display device 35 is, for example, a display where a liquid crystal display panel or an organic electro-luminescence (EL) display panel is provided as a display unit. The display device 35 displays various images acquired from the control device 30 on the display unit. The display device 35 is connected to the control device 30 via a cable in a communicative manner. As a result of this, the display device 35 performs an operation based on the control signal acquired from the control device 30. Further, wired communication via a cable is performed according to, for example, a standard such as Ethernet (registered trademark), USB, or the like. Alternatively, the display device 35 may be connected to the control device 30 by wireless communication performed according to a communication standard such as Wi-Fi (registered trademark), or the like.

<Summary of the Defect Repair Apparatus>

Next, the summary of the defect repair apparatus 1 will be described.

As described above, the defect repair apparatus 1 causes the gas supply unit 15 to supply the gas G to the defect portion of the mask M and causes the charged particle beam emission unit 13 to emit the charged particle beams B, thereby forming the deposition film on the defect portion of the mask M. The front end of the gas supply unit 15 is provided with a nozzle (not shown) discharging the gas G. The nozzle is configured to move up and down so that while the stage 12 or the displacement unit 12a moves, the nozzle is withdrawn (retracted) upward so as not to be in contact with the mask. The defect portion of the mask M is horizontally moved by the stage 12 to the position 13P where the charged particle beams are emitted, and then the displacement unit 12a operates in such a manner that the position 13P is at a predetermined height with respect to the charged particle beam emission unit. Afterward, the nozzle of the gas supply unit 15 is descended so that the gas G is discharged to the position on which the deposition is desired to be performed. The defect repair apparatus 1 performs imaging of the defect portion at the position 13P by using the charged particle beam emission unit 13 and the secondary particle detection unit 14 to obtain the contour of the defect. Then, the shape and the area of the defect are calculated by performing overlap comparison with the contour of the normal shape of the same pattern that is previously acquired.

Herein, the normal shape may be CAD data of the position. Alternatively, in the case of a repetitive pattern, the normal shape may be obtained by performing imaging at a normal position corresponding to the defect portion and by extracting the contour. The growth rate of the deposition film varies depending on the area of the film. The defect repair apparatus 1 specifies, based on the calculated area and previously stored calibration data—that is data representing a relationship between the amount of irradiation with the charged particle beams B and the area of the deposition film to be formed of a predetermined film thickness—the amount of irradiation with the charged particle beams B required to form the deposition film of the predetermined film thickness as a first irradiation amount. The predetermined film thickness is a film thickness that is previously determined, for example, a unit film thickness such as 100 nm, or the like. Further, the predetermined film thickness may be another film thickness instead of the unit film thickness. That is, the predetermined film thickness may be thinner than 100 nm, or may be thicker than 100 nm. Further, the defect repair apparatus 1 calculates a value by multiplying the specified first irradiation amount and the specified formation-planned film thickness, as a second irradiation amount that is the amount of irradiation with the charged particle beams B required to form the deposition film of the specified formation-planned film thickness. As a result of this, the defect repair apparatus 1 forms the deposition film of the desired film thickness on the defect portion.

However, in the case where the defect portion of the mask M is repaired in this manner, depending on the charged particle beams B, but when the state of the defect repair apparatus 1 or the mask M is changed, the deposition film of the desired film thickness may not be formed in the defect region of the mask M. The corresponding processing conditions include, for example, the temperature of the mask M, the state of the surface of the mask M, or the like. Further, the processing conditions may include other conditions.

Thus, the defect repair apparatus 1 corrects the above-described calibration data based on a target film thickness that is the film thickness of the deposition film that is formed by the charged particle beam emission unit 13 and the gas supply unit 15. Further, the defect repair apparatus 1 forms the deposition film on the defect portion of the mask M using the amount of irradiation with the charged particle beams B which is based on correction data that is the corrected calibration data. As a result of this, even if the processing conditions change, the defect repair apparatus 1 is capable of forming the deposition film of a desired film thickness on the defect portion of the mask M. In the present embodiment, a process in which the defect repair apparatus 1 corrects the calibration data based on the target film thickness and a process in which the defect repair apparatus 1 repairs the defect portion of the mask M based on the correction data will be described in detail.

Figure 7:
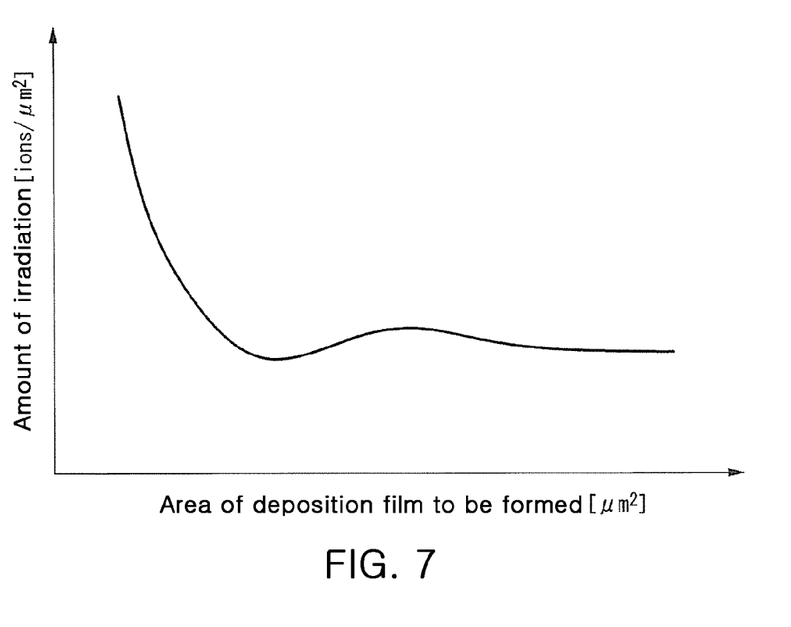
FIG. 7 is a diagram illustrating an example of a graph of calibration data.

Herein, FIG. 7 is a diagram illustrating an example of a graph of the calibration data. As shown in FIG. 7, the calibration data represents a relationship between the area of the deposition film to be formed and the amount of irradiation with the charged particle beams B. The defect repair apparatus 1 may be configured to previously store the calibration data provided by a manufacturer of the defect repair apparatus 1, or may be configured to generate the calibration data by a pilot experiment, or the like. Hereinafter, as an example, the case where the calibration data is previously stored in the defect repair apparatus 1 will be described.

<A Hardware Configuration of the Control Device>

Figure 8:
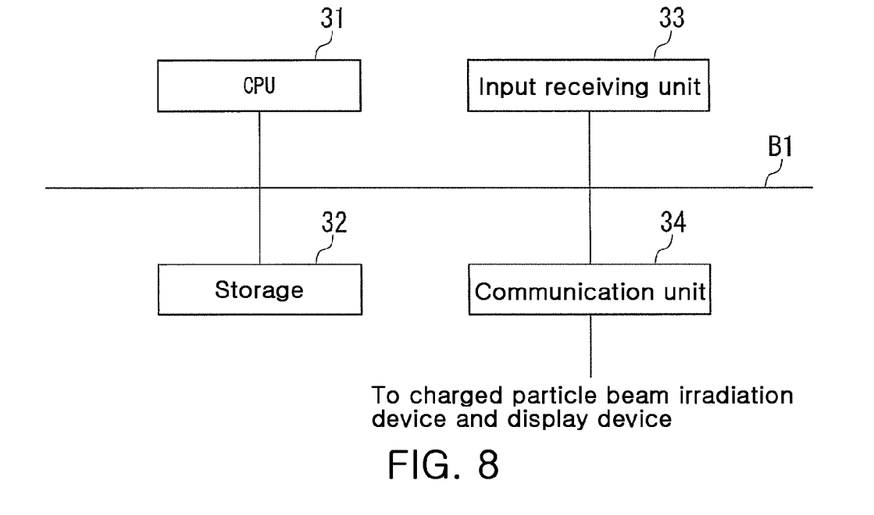
FIG. 8 is a diagram illustrating an example of a hardware configuration of a control device 30.

Hereinafter, with reference to FIG. 8, the hardware configuration of the control device 30 will be described. FIG. 8 is a diagram illustrating an example of the hardware configuration of the control device 30.

The control device 30 includes, for example, a central processing unit (CPU) 31, a storage 32, an input receiving unit 33, and a communication unit 34. These components are connected via a bus B1 so that communication with each other is possible. Further, the control device 30 performs communication with the charged particle beam irradiation device 10 and the display device 35 individually through the communication unit 34.

The CPU 31 executes various programs stored in the storage 32.

Examples of the storage 32 include, for example, a hard disk drive (HDD), a solid state drive (SSD), an electrically erasable programmable read-only memory (EEPROM), a read-only memory (ROM), a random access memory (RAM), or the like. Further, the storage 32 may be, instead of being built into the control device 30, an external storage device accessed via a digital input/output port, such as an USB, or the like. The storage 32 stores various pieces of information or images that the control device 30 processes, various programs, the above-described calibration data, the correction data, or the like.

The input receiving unit 33 is, for example, an input device such as a keyboard, a mouse, a touch pad, or the like. Further, in the case where the control device 30 is integrated with the display device 35, the input receiving unit 33 may be another input device, such as a touch panel integrated with the display unit of the display device 35, or the like.

The communication unit 34 includes, for example, a digital input/output port, such as a USB, etc., an Ethernet (registered trademark) port, or the like.

<A Functional Configuration of the Control Device>

Figure 9:
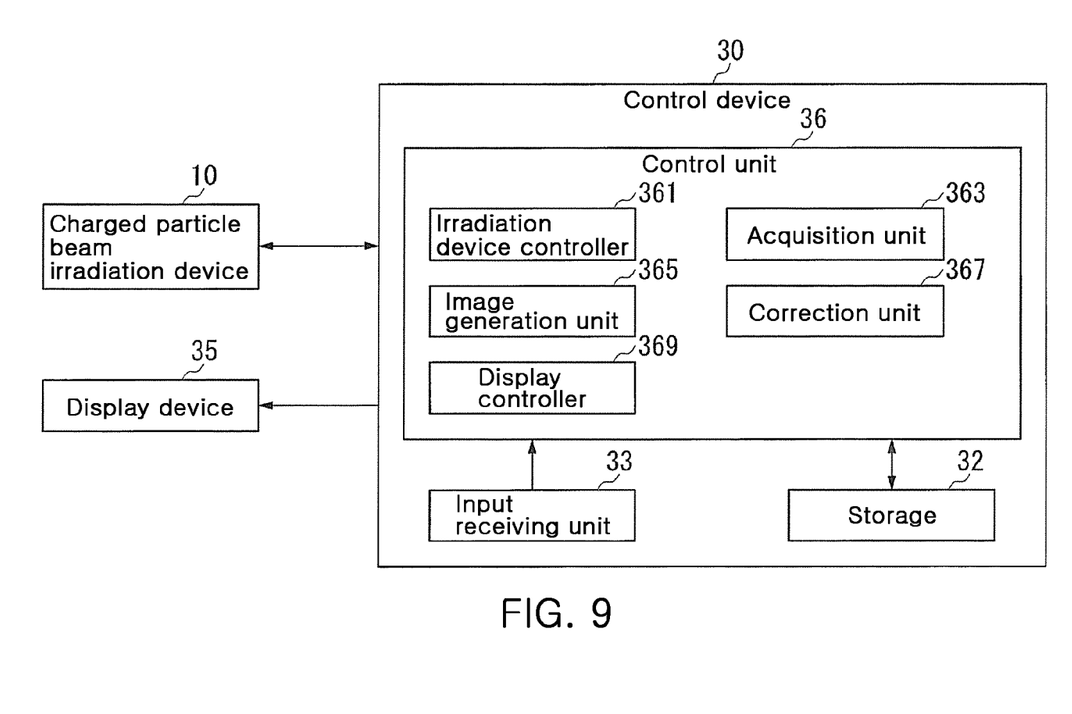
FIG. 9 is a diagram illustrating an example of a functional configuration of a control device 30.

Hereinafter, with reference to FIG. 9, the functional configuration of the control device 30 will be described. FIG. 9 is a diagram illustrating an example of the functional configuration of the control device 30.

The control device 30 includes the storage 32, the input receiving unit 33, and a control unit 36.

The control unit 36 controls the whole control device 30. The control unit 36 includes an irradiation device controller 361, an acquisition unit 363, an image generation unit 365, a correction unit 367, and a display controller 369. These functional units of the control unit 36 may be implemented by, for example, executing, by the CPU 31, various programs stored in the storage 32. Further, some or all of the functional units may be a hardware functional units such as large scale integration (LSI), an application-specific integrated circuit (ASIC), or the like.

The irradiation device controller 361 controls the whole charged particle beam irradiation device 10. For example, the irradiation device controller 361 controls the operation of causing the stage 12 and the displacement unit 12a to move the defect of the mask M to the position 13P where irradiation with the charged particle beams takes place, the operation of moving the nozzle of the gas supply unit 15 up and down or of discharging the gas G, and the operation of the charged particle beam emission unit 13 for imaging or repairing the defect.

The acquisition unit 363 acquires information indicating the secondary particles P detected by the secondary particle detection unit 14 from the secondary particle detection unit 14. Further, the acquisition unit 363 acquires information indicating the film thickness measured by the film thickness measurement unit 16 from the film thickness measurement unit 16.

The image generation unit 365 generates a pattern image of the mask M by synchronizing scanning with the charged particle beams B by the charged particle beam emission unit 13 and a detection signal detected by the secondary particle detection unit 14.

The correction unit 367 reads the calibration data previously stored in the storage 32 from the storage 32. The correction unit 367 corrects the read calibration data based on the information acquired by the acquisition unit 363 from the film thickness measurement unit 16. The correction unit 367 stores the corrected calibration data, namely, the correction data, in the storage 32.

The display controller 369 generates various images based on the manipulation received from the user. The display controller 369 causes the display unit of the display device 35 to display the generated images. For example, the display controller 369 generates, based on the manipulation received from the user, an image containing the observation image generated by the image generation unit 365, and causes the display unit to display the generated image. For example, the display controller 369 may change, based on the manipulation received from the user, the magnification of the image and may cause the display unit to display the resulting image, or may switch a secondary electron phase, a secondary ion phase, secondary ionic species, or the like and may cause the display unit to display the resulting image.

<A Process in which the Defect Repair Apparatus Corrects the Calibration Data Based on the Target Film Thickness>

Figure 10:
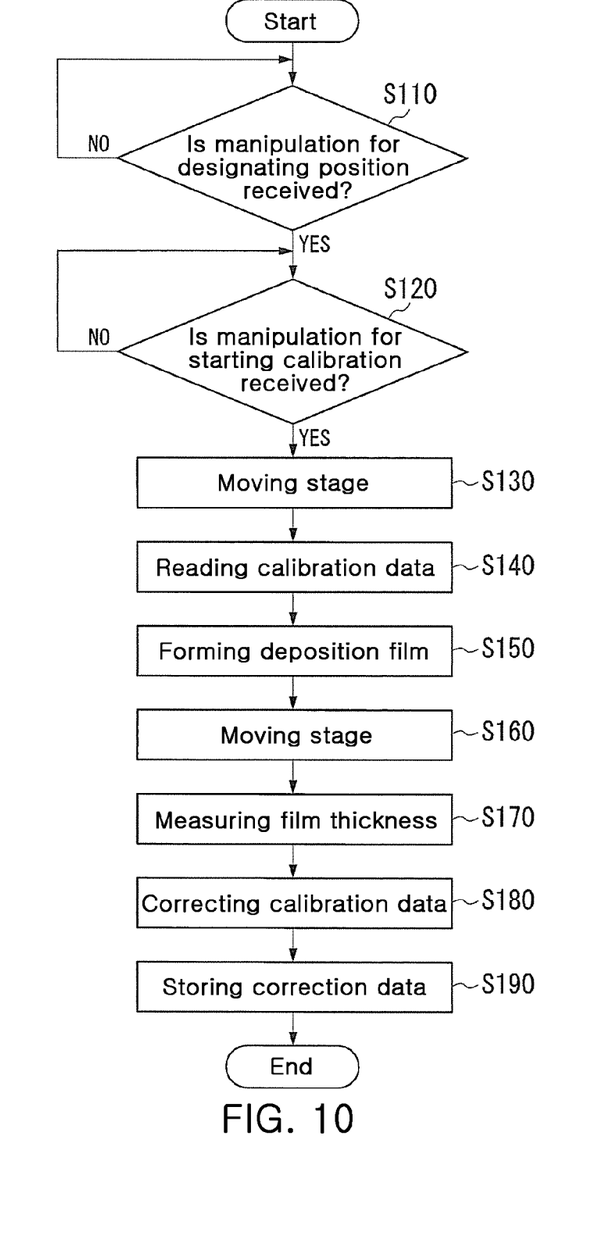
FIG. 10 is a flowchart illustrating an example of a process in which a defect repair apparatus 1 corrects calibration data based on a target film thickness.

Hereinafter, with reference to FIG. 10, the process in which the defect repair apparatus 1 corrects the calibration data based on the target film thickness will be described. FIG. 10 is a flowchart illustrating an example of a process in which the defect repair apparatus 1 corrects the calibration data based on the target film thickness. Hereinafter, for convenience of description, the process of correcting the calibration data is referred to as calibration. Further, hereinafter, as an example, a case where a subject for calibration which is a subject used for correcting the calibration data is placed on the above-described cassette C will be described.

The irradiation device controller 361 waits until receiving the manipulation for designating, as a designated position, a position at which the deposition film is formed on the subject for calibration, at step S110. For example, the irradiation device controller 361 receives the manipulation from the user through a manipulation screen displayed on the display unit of the display device 35 by the display controller 369. Further, when the subject for calibration is the mask M, the position may be any position that is different from the position of the defect portion among the positions within the upper surface of the mask M. However, the position is preferably the position within a surface that is not used for photolithography among the surfaces of the mask M. When receiving the manipulation at step S110—YES, the irradiation device controller 361 waits until receiving the manipulation for starting calibration, at step S120. For example, the irradiation device controller 361 receives the manipulation from the user through the above-described manipulation screen. When receiving the manipulation for starting calibration at step—YES, the irradiation device controller 361 controls the displacement unit 12a to move the position of the stage 12 to the position where irradiation with the charged particle beams B by the charged particle beam emission unit 13 is possible with respect to the designated position designated at step S110, at step S130.

Next, the irradiation device controller 361 reads the calibration data previously stored in the storage 32 from the storage 32, at step S140. Next, the irradiation device controller 361 controls, based on the calibration data read at step S140, the charged particle beam emission unit 13 and the gas supply unit 15 to form the deposition film at the designated position designated at step S110, at step S150. Herein, the operation at step S150 will be described.

The irradiation device controller 361 specifies, based on the calibration data, the amount of irradiation with the charged particle beams B which is required to form the deposition film of the previously determined area and of the predetermined film thickness, as the first irradiation amount. The previously determined area is an area that may be measured by the film thickness measurement unit 16. In the case where the film thickness measurement unit 16 is a white light interference measurement device, the area is, for example, set to a value ranging from about 4 $\mu m^2$ to 100 $\mu m^2$. The irradiation device controller 361 forms, based on the specified first irradiation amount, the deposition film of the previously determined area at the designated position designated at step S110. In this case, the film thickness of the deposition film formed at the designated position refers to the target film thickness. The target film thickness may exceeds or may be less than the predetermined film thickness depending on the above-described processing conditions, and thus the target film thickness is not necessarily limited to the film thickness equal to the predetermined film thickness.

After the operation at step S140, the irradiation device controller 361 controls the displacement unit 12a to move the position of the stage 12 to the position at which the target film thickness, which is the film thickness of the deposition film formed at step S150, is possibly measured by the film thickness measurement unit 16, at step S160. Next, the irradiation device controller 361 controls the film thickness measurement unit 16 to measure the target film thickness, at step S170. At step S170, the film thickness measurement unit 16 measures the target film thickness and outputs information indicating the measured target film thickness to the control device 30. Then, the acquisition unit 363 acquires the information from the control device 30.

Next, the correction unit 367 corrects, based on the film thickness (specifically, the target film thickness measured at step S170) indicated by the information that the acquisition unit 363 acquires from the film thickness measurement unit 16, the calibration data read at step S140, at step S180. Herein, the operation at step S180 will be described. The correction unit 367 calculates, for example, a value by dividing the target film thickness measured at step S170 by the above-described predetermined film thickness. That is, the correction unit 367 calculates a ratio indicating the difference between the predetermined film thickness and the target film thickness (a ratio indicating a difference). The correction unit 367 multiplies the calculated value and each amount of irradiation contained in the calibration data, thereby correcting the calibration data. That is, the correction unit 367 shifts the curve of the graph shown in FIG. 7 in the direction along the vertical axis according to the value. At step S180, the corrected calibration data refers to the above-described correction data. Alternatively, the correction unit 367 may correct the calibration data by using another method based on the target film thickness.

After the operation at step S180, the correction unit 367 stores the correction data, which is the calibration data corrected at step S180, in the storage 32 at step S190, and the process ends.

In this way, the defect repair apparatus 1 corrects the calibration data based on the target film thickness.

<A Process in which the Defect Repair Apparatus Repairs the Defect Portion of the Mask Based on the Correction Data>

Figure 11:
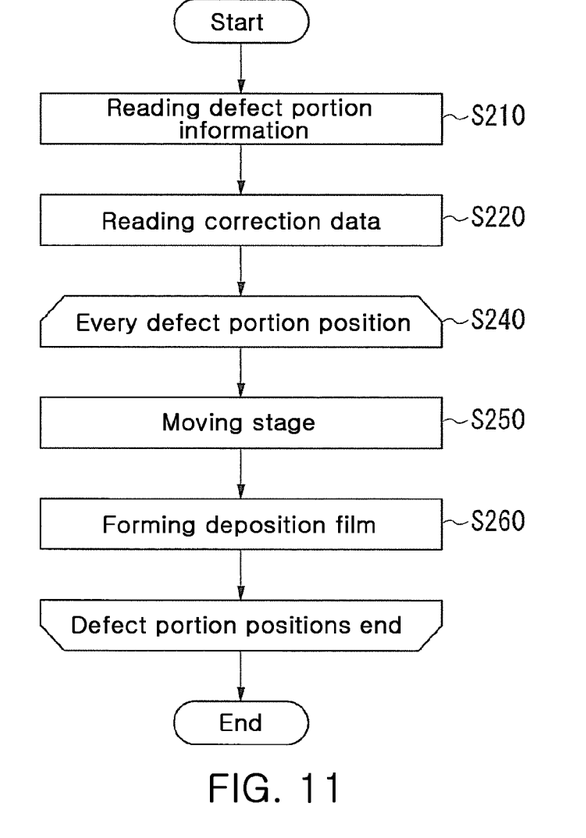
FIG. 11 is a flowchart illustrating an example of a process in which a defect repair apparatus 1 repairs a defect portion of a mask M based on correction data.

Next, the process in which the defect repair apparatus 1 repairs the defect portion of the mask M based on the correction data will be described. FIG. 11 is a flowchart illustrating an example of the process in which the defect repair apparatus 1 repairs the defect portion of the mask M based on the correction data. Hereinafter, as an example, the case where the correction data is previously stored in the storage 32 by the process in the flowchart shown in FIG. 10 will be described.

The irradiation device controller 361 reads defect portion information that is acquired from a defect inspection device, from the storage 32, at step S210. The defect portion information is information indicating a defect portion position that is the position of at least one defect portion of the mask M. Then, the irradiation device controller 361 performs, based on the defect portion information, matching for an offset or an axis tilt of the stage coordinate system between the defect inspection device and the defect repair apparatus 1.

Next, the irradiation device controller 361 reads the correction data previously stored in the storage 32 from the storage 32, at step S220.

Next, for each of the at least one defect portion position indicated by the defect portion information read at step S210, the irradiation device controller 361 repeatedly performs the process from step S250 to step S260, at step S240.

The irradiation device controller 361 controls the displacement unit 12a to move the position of the stage 12 to the position where irradiation with the charged particle beams B by the charged particle beam emission unit 13 is possible with respect to the defect portion position selected at step S240, at step S250. Then, the irradiation device controller 361 causes the charged particle beam irradiation device 10 to emit the charged particle beams B to acquire the observation image of the defect portion of the mask M, and calculates the shape and the area of the defect portion.

Next, the irradiation device controller 361 causes, based on the correction data read at step S220, the deposition film to be formed on a target defect portion, thereby repairing the defect portion, at step S260. Herein, the operation at step S260 will be described.

The irradiation device controller 361 converts, based on the size of the defect portion specified from the observation image, the size into the area of the target defect portion. The irradiation device controller 361 specifies, based on the correction data, the amount of irradiation with the charged particle beams B which is required to form the deposition film of the predetermined film thickness on the target defect portion of the area, as the first irradiation amount. The irradiation device controller 361 calculates a value by multiplying the specified first irradiation amount and the specified formation-planned film thickness, as the second irradiation amount. The irradiation device controller 361 forms, based on the calculated second irradiation amount, the deposition film of the film thickness that is substantially the same as the formation-planned film thickness except for an error, on the target defect portion. That is, even if the processing conditions change, the defect repair apparatus 1 is capable of forming the deposition film of a desired film thickness on the target defect portion. In this way, the defect repair apparatus 1 forms the deposition film of the desired film thickness, so that the deposition film with a desired transmittance is formed.

After the operation at step S260, the irradiation device controller 361 proceeds to step S240 and selects the unselected defect portion position. Further, at step S240, when no unselected defect portion position is present, the irradiation device controller 361 ends the process.

As described above, a mask defect repair apparatus according to the embodiment (in this example, the defect repair apparatus 1) forms a standard deposition film by charged particle beam-induced deposition, adjusts the amount of irradiation (in this example, the second irradiation amount) with the charged particle beams (in this example, the charged particle beams B) by using the result of measuring the film thickness, and forms the deposition film on the defect of a mask (in this example, the mask M) to repair the defect. The mask defect repair apparatus includes: a charged particle beam emission unit (in this example, the charged particle beam emission unit 13) emitting the charged particle beams; a stage moving the mask; a gas supply unit (in this example, the gas supply unit 15) supplying gas to form the deposition film by irradiation with the charged particle beams; a control unit (in this example, the control unit 36) controlling the charged particle beam emission unit and the gas supply unit; a storage (in this example, the storage 32) storing calibration data (in this example, the correction data) that represents a relationship between an area of the deposition film and the amount of irradiation with the charged particle beams; a film thickness measurement unit measuring the film thickness of the standard deposition film; and a correction unit (in this example, the correction unit 367) correcting the amount of irradiation with the charged particle beams based on the calibration data and the film thickness of the standard deposition film measured by the film thickness measurement unit. The control unit controls the charged particle beams to be emitted with the amount corrected by the correction unit while the gas is supplied to the defect of the mask, thereby forming the deposition film. As a result of this, the mask defect repair apparatus is capable of performing defect repair with high accuracy, without exposure of the mask to air while being moved between the mask defect repair apparatus and an inspection device (in this example, the defect inspection device). Herein, the halftone mask has, for example, a pattern film of transmittance that varies in a range of about 10% to 50%. Even for such a halftone mask, the mask defect repair apparatus performs correction on the calibration data as described above, so that the defect repair deposition film with desired transmittance is formed.

Further, in the mask defect repair apparatus, as the film thickness measurement unit, a white light interference measurement device may be used. As a result of this, the mask defect repair apparatus is capable of forming, based on the target film thickness measured by the film thickness measurement unit which is the white light interference measurement device, the deposition film of a desired film thickness on the defect portion of the mask even if the state of the mask defect repair apparatus or the mask changes.

Further, in the mask defect repair apparatus, the area of the deposition film may be smaller than the area of the standard deposition film.

Further, in the mask defect repair apparatus, as the film thickness measurement unit, an atomic force microscope may be used. As a result of this, the mask defect repair apparatus is capable of forming, based on the target film thickness measured by the film thickness measurement unit which is the atomic force microscope, the deposition film of a desired film thickness on the defect portion of the mask even if the state of the mask defect repair apparatus or the mask changes.

Further, in the mask defect repair apparatus, the area of the deposition film may be larger than the area of the standard deposition film.

Further, the mask defect repair apparatus according to the present embodiment corrects, based on a target film thickness that is the film thickness of the deposition film formed by a charged particle beam emission unit (in this example, charged particle beam emission unit 13) and a gas supply unit (in this example, the gas supply unit 15), a calibration data previously stored in a storage (in this example, storage 32) as data representing a relationship between the area of the deposition film to be formed and an amount of irradiation with charged particle beams (in this example, the charged particle beams B), and forms a deposition film on a defect portion of a mask (in this example, mask M), based on the amount (in this example, the second irradiation amount) of irradiation with the charged particle beams based on the corrected calibration data (in this example, correction data). As a result of this, even if the processing conditions change, the defect repair apparatus 1 is capable of forming the deposition film of a desired film thickness on the defect portion of the mask. As a result of this, the mask defect repair apparatus is capable of forming the deposition film of a desired film thickness on the defect portion of the mask even if the state of the mask defect repair apparatus or the mask changes.

Further, in the mask defect repair apparatus, the charged particle beam emission unit and the film thickness measurement unit (in this example, the film thickness measurement unit 16) is provided in a receiving unit (in this example, processing room R). As a result of this, each time the mask defect repair apparatus performs the formation of the deposition film on the defect portion of the mask and measurement of the film thickness of the formed deposition film, placement or detachment of the mask M from the mask defect repair apparatus does not need to be performed, so that throughput of manufacturing the mask is reduced and there is no risk of creating a new defect, whereby productivity in manufacturing the mask may be enhanced.

Further, the mask defect repair apparatus corrects the calibration data based on the predetermined film thickness and the target film thickness. As a result of this, the mask defect repair apparatus is capable of forming, based on the predetermined film thickness and the target film thickness, the deposition film of a desired film thickness on the defect portion of the mask even if the state of the mask defect repair apparatus or the mask changes. Further, the mask defect repair apparatus is capable of forming the deposition film with desired transmittance for defect repair.

Further, the mask defect repair apparatus corrects the calibration data based on the ratio that indicates the difference between the predetermined film thickness and the target film thickness. As a result of this, the mask defect repair apparatus is capable of forming, based on the ratio indicating the difference between the predetermined film thickness and the target film thickness, the deposition film of a desired film thickness on the defect portion of the mask even if the state of the mask defect repair apparatus or the mask changes. Further, the mask defect repair apparatus is capable of forming the deposition film with desired transmittance for defect repair.

Further, the mask defect repair apparatus forms the deposition film of the target film thickness on the mask or a subject different from the mask. As a result of this, the mask defect repair apparatus is capable of forming, based on the deposition film of the target film thickness formed on the mask or the subject different from the mask, the deposition film of a desired film thickness on the defect portion of the mask even if the state of the mask defect repair apparatus or the mask changes.

Further, in the mask defect repair apparatus, the film thickness measurement unit is a white light interference measurement device or an atomic force microscope. As a result of this, the mask defect repair apparatus is capable of forming, based on the target film thickness measured by the film thickness measurement unit that is the white light interference measurement device or the atomic force microscope, the deposition film of a desired film thickness on the defect portion of the mask even if the state of the mask defect repair apparatus or the mask changes.

Although the embodiment of the present invention has been described in detail with reference to the accompanying drawings, the detailed configuration is not limited to this embodiment, and modifications, substitutions, and deletions may be made without departing from the scope of the present invention.

Further, a program for implementing a function of any component in the above-described device (for example, the control device 30) may be recorded on a computer-readable recording medium, and the program may be read by a computer system for execution. Further, it is noted that the "computer system" herein refers to inclusion of an operating system (OS) or hardware, such as a peripheral device, or the like. Furthermore, the "computer-readable recording medium" refers to a portable medium such as a flexible disk, a magneto-optical disk, a ROM, a compact disk (CD)-ROM, or the like; or a storage device such as a hard disk built in to the computer system, or the like. Also, the "computer-readable recording medium" may include a device that keeps a program for a particular time, for example, a volatile memory (RAM) in the computer system which becomes a server or a client when the program is transmitted via a network such as the Internet, or the like; or a communication circuit such as a telephone circuit, or the like.

Further, the program may also be transmitted from the computer system having a storage device or the like in which the program is stored to another computer system via a transmission medium or by means of transmission waves in a transmission medium. Here, the "transmission medium" used for transmitting the program refers to a medium having an information transmission function, for example, a network (a communication network) such as the Internet, or the like; or a communication circuit (a communication line) such as a telephone circuit, or the like.

Further, the program may be configured to implement a part of the above-described functions. Furthermore, the program may be configured to implement the above-described functions in combination with a program already recorded in the computer system, for example, a so-called differential file (a differential program).

What is claimed is:

1. A mask defect repair method comprising:
    forming a standard deposition film by charged particle beam-induced deposition before repairing a mask defect of a mask;
    measuring a film thickness of the standard deposition film;
    correcting calibration data that represents a relationship between an area of a deposition film having a predetermined thickness and an amount of irradiation with charged particle beams based at least in part on the film thickness of the standard deposition film;
    moving the mask defect to a position at which irradiation with the charged particle beams takes place; and
    emitting the charged particle beams in the amount determined based at least in part on the corrected calibration data on to a portion of the mask at which the mask defect has actually occurred while supplying gas for forming the deposition film on the mask defect to form the deposition film, wherein the standard deposition film is different from the deposition film on the mask defect.

* * * * *